United States Patent
Yudovsky

(12)
(10) Patent No.: US 6,555,164 B1
(45) Date of Patent: Apr. 29, 2003

(54) SHADOW RING AND GUIDE FOR SUPPORTING THE SHADOW RING IN A CHAMBER

(75) Inventor: Joseph Yudovsky, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 58 days.

(21) Appl. No.: 09/717,706

(22) Filed: Nov. 20, 2000

Related U.S. Application Data

(62) Division of application No. 09/200,305, filed on Nov. 25, 1998, now Pat. No. 6,168,668.

(51) Int. Cl.[7] .................................................. C23C 16/04
(52) U.S. Cl. .......................... 427/248.1; 427/248.1; 427/444; 414/214
(58) Field of Search ............................. 427/444, 248.1; 118/715, 728, 729; 414/214

(56) References Cited

U.S. PATENT DOCUMENTS

| | | | |
|---|---|---|---|
| 5,328,722 A | 7/1994 | Ghanayem et al. ......... 427/250 |
| 5,574,247 A | 11/1996 | Nishitani et al. ........... 118/708 |
| 5,669,977 A | * 9/1997 | Shufflebotham et al. .... 118/500 |
| 6,126,382 A | * 10/2000 | Scales et al. ............... 198/394 |
| 6,143,082 A | * 11/2000 | McInerney et al. ......... 118/719 |

* cited by examiner

Primary Examiner—Timothy Meeks
(74) Attorney, Agent, or Firm—Moser, Patterson & Sheridan

(57) ABSTRACT

The invention generally relates to a processing system and related methods that include a chamber, a pedestal disposed in the chamber, a shadow ring and a set of alignment and support tabs which receive and directly align a substrate with a shadow ring, substantially independently of the pedestal. In one aspect of the invention, a shadow ring is provided which includes an upper shielding portion and a lower alignment and support member. The alignment and support member preferably includes one or more alignment and support tabs. A set of lift pins are preferably disposed in the chamber that may align the substrate and shadow ring with the pedestal. At least one pedestal recess may be located in the pedestal to receive the alignment and support tabs when the pedestal is in a raised position and in some instances to align the substrate and shadow ring to the pedestal.

2 Claims, 10 Drawing Sheets

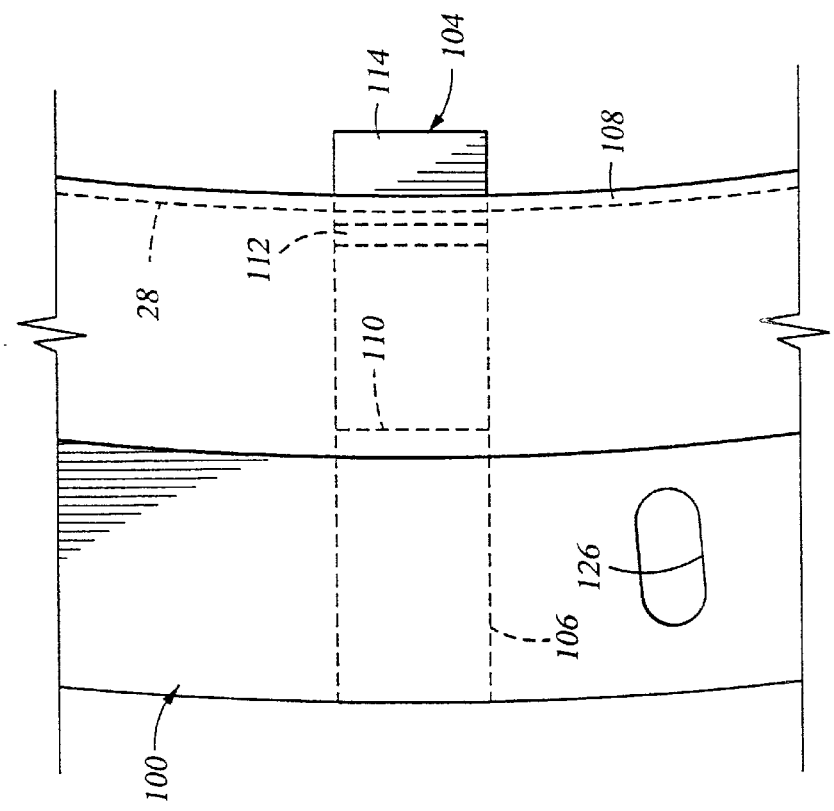
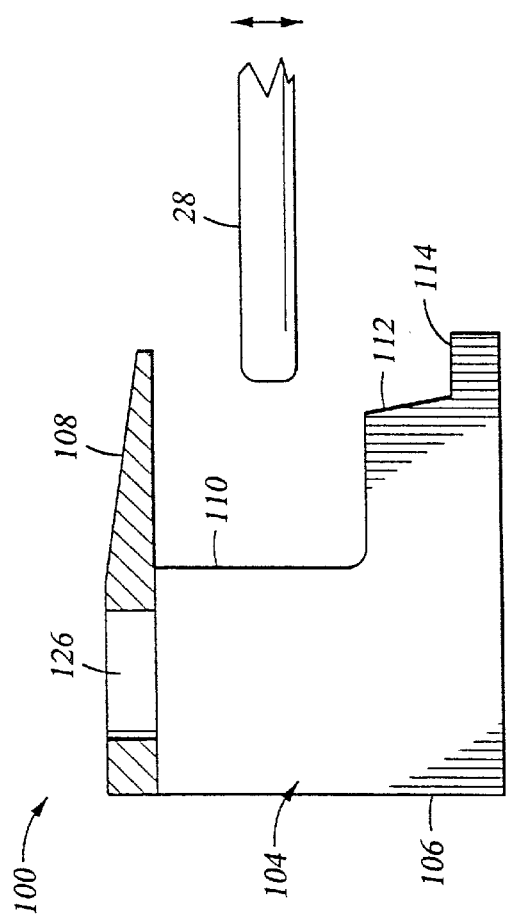
Fig. 3b
Fig. 3a

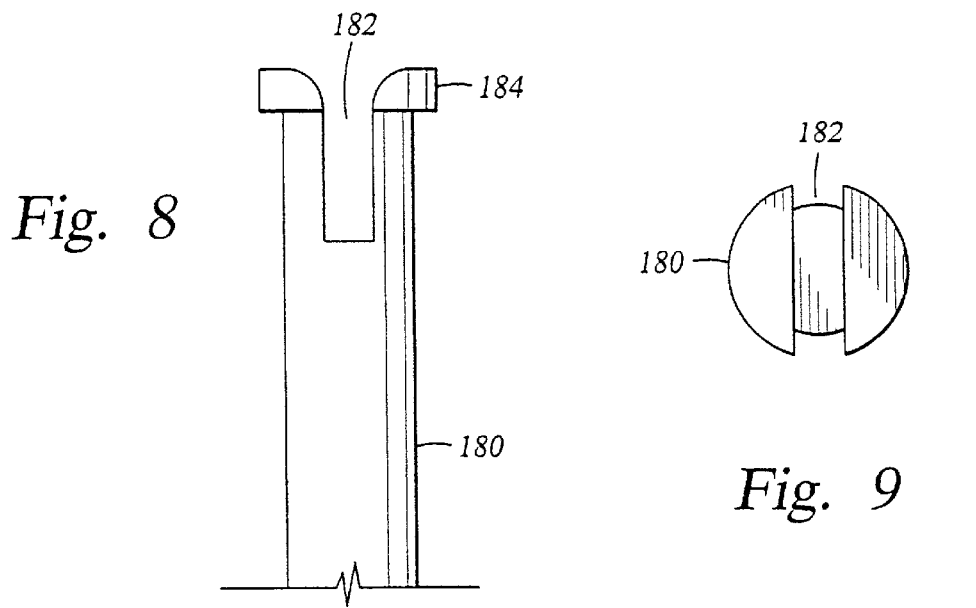
Fig. 8
Fig. 9
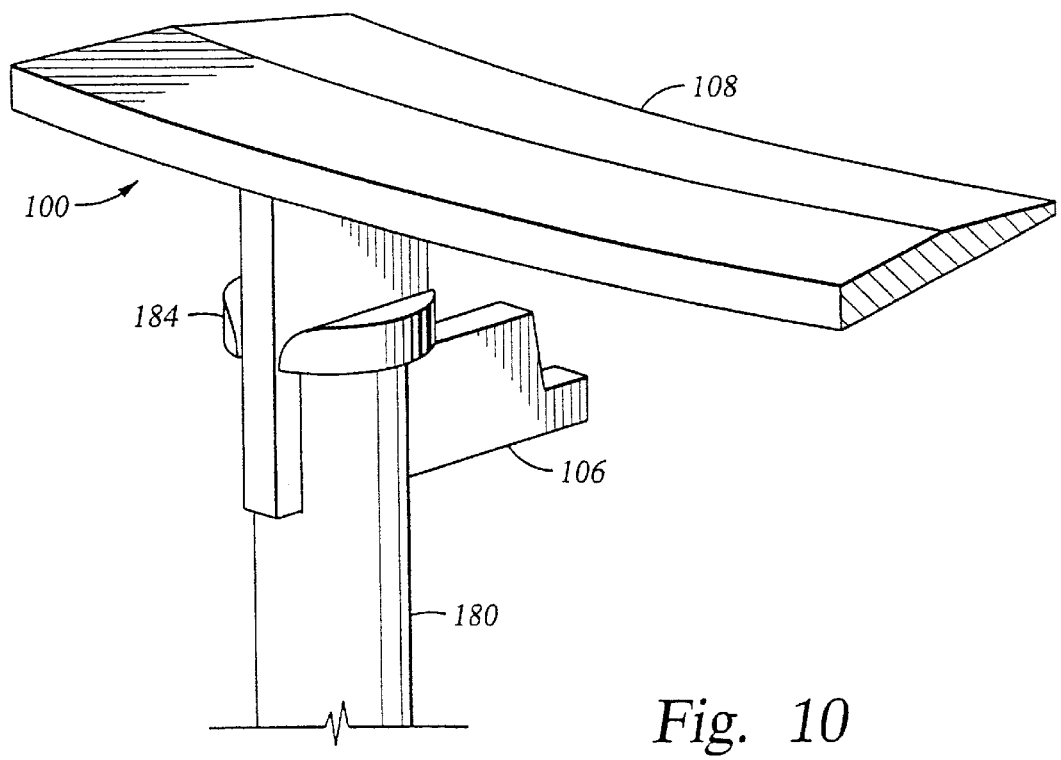
Fig. 10

SHADOW RING AND GUIDE FOR SUPPORTING THE SHADOW RING IN A CHAMBER

This is a divisional application of application Ser. No. 09/200,305 filed on Nov. 25, 1998, which has issued as U.S. Pat. No. 6,168,668, on Jan. 2, 2001.

BACKGROUND OF THE INVENTION

1. Field of the Invention

The present invention relates to the manufacture of integrated circuits and other electronic devices on substrates. More particularly, the invention relates to a method and apparatus for aligning a substrate, a shadow ring, and a pedestal within a processing chamber.

2. Background of the Related Art

In the manufacture of integrated circuits and other electronic devices, multiple layers of materials are deposited onto and etched from substrates to form interconnections between electronic devices implanted in the substrate. Processing systems typically include vacuum processing chambers in which substrates are supported on pedestals. The equipment is designed to introduce substrates into the chambers via robot assemblies and to place the substrates on the pedestal for processing.

In some processes, it has become important to prevent deposition on the edge and backside of the substrates, because such deposited material can flake off these surfaces and become particles that may compromise the integrity of a chip derived from that or other substrates. To address this challenge, shadow rings have been used to shield the outer edge of the substrate from the deposition material. One system that utilizes shadow rings is the WxZ™ chamber available from Applied Materials, Inc., located in Santa Clara, Calif. The shadow ring is placed on the pedestal, adjacent the substrate edge, to shadow that edge from deposition material.

One difficulty encountered in the use of pedestals and shadow rings is that it is very difficult to align the substrate, the pedestal, and the shadow ring. Typically, the substrate is aligned to the pedestal and the shadow ring is then separately aligned to the pedestal. Thus, the substrate is indirectly aligned to the shadow ring. Depending on the system tolerances and wear of the parts, the indirect alignment may not insure sufficient shadowing of the substrate edge.

FIG. 1 shows one typical arrangement of a shadow ring positioned over a substrate in a chemical vapor deposition (CVD) chamber 2. The chamber has sidewalls 4, top wall 6, and bottom wall 8. At the top is a gas inlet 12 connected to a gas distribution element 20, such as a "showerhead", which uniformly delivers gases into the chamber. Near the chamber bottom is a pedestal 22 that may include a lift tube 24 and a pedestal lift 26. The pedestal 22 supports a substrate 28, such as a wafer, on its upper surface during processing. The substrate may be held in place on the pedestal by a plurality of vacuum passages. A set of lift pins 34 extend through channels in the pedestal to lift and place a substrate between a robot blade and the pedestal. The pins are supported on their lower end on a lift plate 36 that is raised and lowered by a pin lift shaft 38 and a lift plate lift 40. The pedestal also includes a gas conduit 42 which is in fluid communication with a gas supply 41 and delivers a purge gas through an annular gas outlet 44, typically about 0.5 to 1.0 mm wide disposed about the perimeter of the pedestal upper surface. The purge gas flows from the annular gas outlet 44 through the gap 48 (shown in FIG. 2), typically about 0.1 mm to 0.3 mm high between the shadow ring and substrate to prevent deposition gases from depositing on the substrate edge and backside. A shadow ring 30 is mounted above the pedestal.

To receive a substrate on the pedestal, the pedestal is lowered, such that the top surface of the lift pins extend through the pedestal. A robot arm (not shown) delivers a substrate to the chamber and places it on the extending pins, typically by virtue of an upward extension of the pins to lift the substrate off the robot, which also provides clearance for the robot retraction. The pedestal then raises to lift the substrate off the lift pins and into proximity to the shadow ring. Process gases flow through the gas inlet and through the showerhead and form a layer(s) on the substrate through thermal decomposition. The shadow ring shields the substrate from the process gases. In theory, the substrate is properly positioned on the pedestal, so that the substrate uniformly overhangs only a portion of the annular space 44. This position allows a non-process gas to flow around the substrate periphery and protect the periphery from the process gases. The concept is disclosed in U.S. Pat. No. 5,516,367, issued to Applied Materials, Inc., the assignee of the present invention, and is incorporated herein by reference.

One challenge presented is to provide proper positioning of the substrate 28 to the shadow ring 30. Where the substrate and shadow ring are misaligned, the gas which is introduced around the substrate edge will experience a different flow resistance about the substrate perimeter, with a resulting differential flow at different substrate edge locations. As a result, backside deposition may occur in low flow areas and the film layer formed on the substrate surface may be disturbed in the non-standard edge purge gas flow area.

Some attempts have been made to forcibly move the substrate laterally after mounting the substrate to the pedestal to better align the shadow ring and substrate by including tapered surfaces on the shadow ring. However, such movement may scrape the substrate surface and leave substances on the pedestal which may then interfere with the operation of the vacuum chuck, or allow the process gases to infiltrate the substrate backside and deposit thereon, creating further contaminants in the processing system and scrap in the process.

Other prior efforts, aimed at reducing particle creation, have reduced or eliminated lateral movement of the substrate with respect to the pedestal and simply increased the shadow ring overhang. By increasing the overhang, the shadow ring is able to overlap the substrate without substantial lateral, aligning movement of the substrate. One way that the increased overhang is accomplished is by decreasing the inner diameter of the shadow ring upper end 52, shown in FIG. 2, so that this diameter is smaller relative to the substrate diameter, resulting in a larger overhang 50. Thus, although these systems accept a greater substrate to shadow ring misalignment, the greater overhang shadows usable portions of the substrate which results in a reduction in usable processed surface area.

Current industry practice demands that at least ninety percent (90%) of film thickness required to be deposited over the entire face of the substrate be present at 3 mm from the substrate edge. However, more recent industry practices have pressed for more efficient systems having a higher film uniformity, i.e., much more than 90%, up to the 3 mm edge, and have even considered imposing film uniformity to a 1.5 mm edge, while preventing all film deposition at the substrate bevel. A substrate has beveled edges that measure 0.5 mm from the substrate edge. To comply with these requirements, the margin for error in aligning the substrate on the pedestal is preferably no greater than about 1 mm measured along the substrate radius. Therefore, prior efforts to avoid close substrate alignment and cover more surface area will not meet these more stringent requirements.

Therefore, there is a need to provide an improved method and related equipment to directly align a substrate and a shadow ring with respect to each other.

SUMMARY OF THE INVENTION

The invention generally relates to a processing system which includes a process chamber, a pedestal disposed in the process chamber, a shadow ring and an alignment and support member that receives and directly aligns a substrate with a shadow ring, independently of the pedestal.

In one aspect of the invention, a shadow ring is provided which includes an upper shielding portion and one or more lower alignment and support members. The alignment and support member preferably includes one or more alignment and support tabs. A set of lift pins are preferably disposed in the chamber to align the substrate and shadow ring with the pedestal. At least one pedestal recess may be located in the pedestal to receive the alignment and support member, and may also align the shadow ring with the pedestal in addition to, or in lieu of, the lift pins.

In another aspect of the invention, a processing chamber is provided with the shadow ring and pedestal of the invention disposed therein. In operation, a robot blade introduces a substrate into the chamber and inserts it into a shadow ring having alignment and support tabs that align and support the substrate directly in the lower portion of the shadow ring. Having aligned the shadow ring with the substrate, lift pins and/or pedestal recesses then align the shadow ring supporting the substrate with the pedestal as the substrate is received onto the pedestal. The present invention may also include a method of aligning a substrate shield and a substrate over a pedestal, including introducing a substrate into a chamber between a substrate shield and a substrate alignment and support member connected to the substrate shield, receiving the substrate into the alignment and support member, and moving the substrate and the alignment and support member onto the pedestal.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3a is a cross section of the shadow ring shown in FIG. 3.

FIG. 3b is an enlarged top view of the shadow ring shown in FIG. 3.

FIG. 8 is a side view of an alternative lift pin embodiment having a slot.

FIG. 9 is an end view of the lift pin slot.

FIG. 10 is a perspective view of the lift pin slot in an engaged position with the alignment and support tab.

DETAILED DESCRIPTION OF A PREFERRED EMBODIMENT

In one aspect of the invention, an improved shadow ring is provided for use in a chemical vapor deposition (CVD) chamber, a physical vapor deposition (PVD) chamber, or an electroplating chamber, or a variety of other chambers used in substrate processing that may use a shield to protect some portion of a substrate or clamp a substrate to a pedestal. The present invention includes the shadow ring, the system using the shadow ring, and methods associated therewith, and generally includes an upper shadow ring shielding surface and a lower substrate alignment and support member. The lower substrate alignment and support member preferably includes one or more substrate alignment and support surfaces. A set of alignment pins may be disposed in the chamber and adapted to align the shadow ring with the pedestal. The terms "bottom", "top", "up", "down", "upper", and "lower" and other positional terms are shown with respect to the embodiments in the figures and may be varied depending on the relative orientation of the processing system. Also, the term "shadow ring" includes those surfaces which overlap a portion of a substrate and protect it from the associated process to which a remaining portion of the substrate is subjected. It specifically includes shadow rings and clamp rings associated with PVD, CVD, and electroplating processes.

Figure 3:
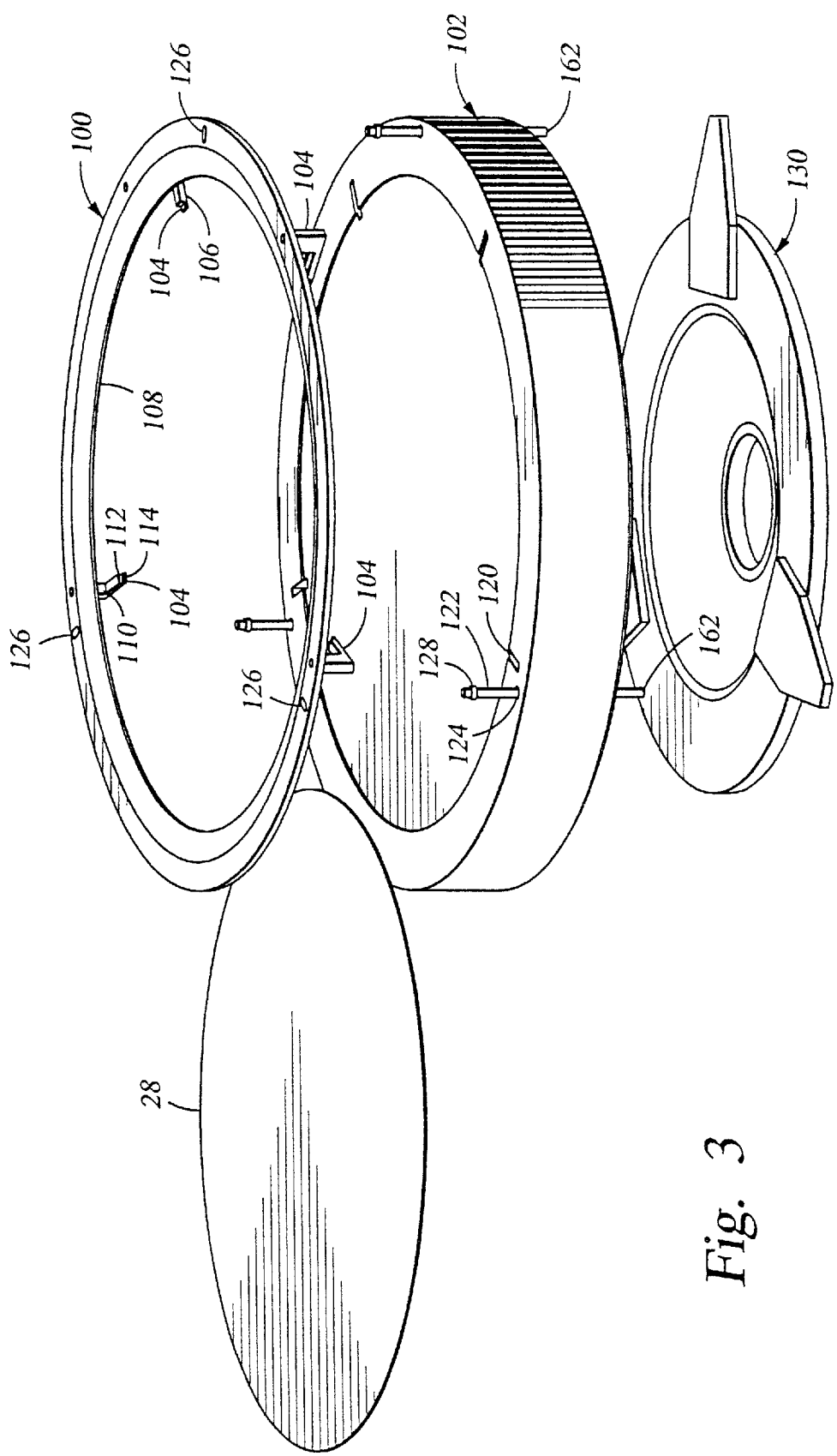
FIG. 3 is a substantially top perspective view of a shadow ring of the present invention.

FIGS. 3, 3a, and 3b shows a substantially top perspective view of one embodiment of the present invention with accompanying details. The shadow ring 100 is shown located above the pedestal 102 with a substrate 28 partially inserted between the shadow ring and pedestal. A lift plate 130 is located below the pedestal 102 and raises and lowers the lift pins 122. The term "pedestal" may include a pedestal, susceptor, heater, cooling element or other support member for the substrate. The shadow ring may be made of aluminum, ceranic, or some other appropriate material and preferably a material with a low thermal expansion coefficient to better maintain alignment between the shadow ring and the substrate. The pedestal may also be made of aluminum or some other typically conductive material, perhaps with a higher conductivity than the shadow ring, to allow cooling or heating through the pedestal to the substrate. The lift plate may be made of aluminum, ceramic, or other materials, or some combination thereof.

The shadow ring includes an upper shielding surface 108 and a lower alignment and support member 104, collectively, that may include a plurality of alignment and support tabs 106, preferably at least three tabs circumferentially spaced about the shadow ring, as will be discussed further herein regarding FIG. 4. The alignment and support tabs 106 include a recessed portion 110, a substrate alignment surface 112 which could be linear or curved, and a lower support 114, positioned inwardly from the substrate alignment surface 112. As shown particularly in FIG. 3*b*, the upper shielding surface 108 may overhang the intersection of the substrate alignment surface 112 and the lower support 114 by some appropriate amount, so that when the substrate is properly positioned, the shielding surface will overhang a portion of the substrate 28. The recessed portion 110 may vary in dimension and should be sufficiently recessed to allow a substrate to be inserted into the shadow ring between the upper shielding surface 108 and the lower support 114. In part, this recess dimension depends on the spacing of the alignment and support tabs 106 about the shadow ring, as explained in FIG. 4. Because substrates are generally circular, the tabs may be positioned about the shadow ring perimeter with sufficient space provided between at least two of such tabs to enable a substrate to pass therebetween for placement upon, and removal from, the tabs. Furthermore, the combination of the plurality of substrate alignment surfaces 112 may create a preferably segmented frustoconical surface to properly align substrates in repetitive fashion to the shadow ring.

The tabs 106 provide alignment between a substrate received on the tabs and the inner diameter of the shadow ring. As will be described further herein, a robot passes a substrate between the substrate alignment surface 112 and lower support 114 portions of the tabs 106 and the underside of the upper shielding surface 108. The shadow ring 100 with the tabs 106 is moved upwardly, where the substrate is received on the substrate alignment surface 112 or lower support 114, and under gravity moves along the substrate alignment surface to be received on the lower support 114 portion of each tab 106. The substrate is thus aligned in a centered position with respect to the inner diameter of the upper shielding surface 108.

In a preferred embodiment, lift pins 122 extend through the pedestal 102 at a pedestal aperture 124 to engage the shadow ring and may be made from ceramic material. The shadow ring may also include a pin engagement aperture 126 through which the pins may at least partially extend to provide alignment of the shadow ring with the pedestal. A portion of the head of each pin is received in aperture 126 to provide pin to shadow ring alignment. The aperture 126 is extended radially to allow the pin head to move radially therein to compensate for thermal expansion/compression of the pedestal and shadow ring components. A pin stop 128 is connected to the lift pin 122 and may serve at least two purposes. First, it provides a stop for the shadow ring, so that the pins support the shadow ring when the shadow ring is raised above the pedestal. This arrangement departs from prior efforts of those in the field, where the lift pins were located inward of the shadow ring and supported the substrate above the pedestal regardless of the shadow ring, which led to the alignment difficulties between the substrate and shadow ring, discussed above. In contrast, the present invention uses the lift pins to support the shadow ring and the shadow ring to support the substrate, and thus, allows alignment of the substrate and shadow ring independently of the pedestal. If the shadow ring is constructed of a material having a low thermal coefficient of expansion such as a ceramic, then the alignment between the shadow ring and the substrate will be better maintained under different temperatures. Secondly, the pin stop 128 also provides a stop for the pin itself, so that it is retained in the pedestal when it is unsupported by the lift plate 130, shown in FIG. 7. The lift plate 130 may raise and lower the shadow ring at various phases in the substrate processing by raising and lowering the lift pins on the distal end 162 of the pin.

The pedestal 102 preferably includes a plurality of pedestal recesses 120 to receive each of the alignment and support tabs as the shadow ring and pedestal are brought into proximity. By properly dimensioning the clearance of the pedestal recesses, the pedestal recesses may serve to align the tabs to the pedestal and thus align the shadow ring and substrate with the pedestal in addition to, or in lieu of, the alignment by the lift pins 122. In the preferred embodiment, the substrate is aligned directly to the shadow ring and independently of the shadow ring alignment to the pedestal.

Figure 4:
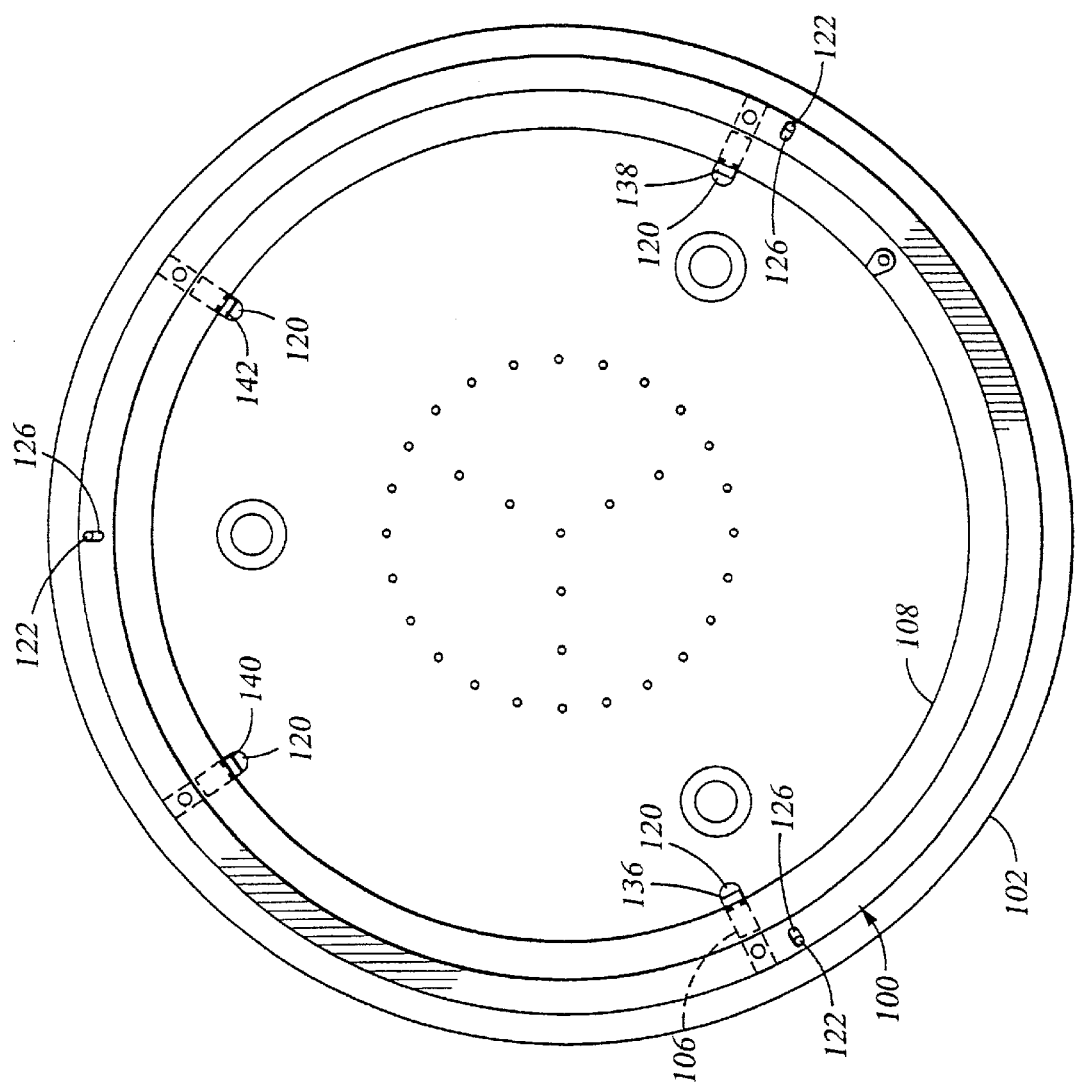
FIG. 4 is a top view of a shadow ring of the present invention over a pedestal.

FIG. 4 is a top view of the shadow ring 100 overlaying the pedestal 102. Pedestal recess 120 is aligned with the alignment and support tabs 106 which may provide alignment in addition to, or in lieu of, the lift pins. Four alignment and support tabs are shown, although more or less can be used. In a preferred embodiment, at least three tabs would be used to provide planar support for the substrate defined by the three support points, positioned about the shadow ring periphery. However, the lower alignment and support member 104 could include, for instance, a single circumferential support with a slot through which the substrate is placed or could include two partially circumferential tabs having surfaces appropriately dimensioned for supporting the substrate, and a variety of other arrangements. Depending on the tab spacing, the recess 120 is dimensioned to receive the substrate between the upper shielding surface 108 and the lower support 114. For instance, if three tabs were used at equal spacing about the shadow ring periphery, the recess dimension may differ from an arrangement of four tabs about the periphery. In general, at least two tabs are positioned on one half of the shadow ring and at least one tab is positioned on the other half to adequately support the substrate with the substrate center of gravity located between the tabs. In the embodiment shown in FIG. 4 with four tabs, the front tabs 136, 138 are spaced farther apart than the back tabs 140, 142 to allow the substrate to be inserted between the upper shielding surface 108 and the lower support 114 of the tabs with a suitable dimension for the recessed portion 110 to allow a substrate to pass through the recessed portions 110 and be supportable on lower support 114. Thus, a plurality of recessed portions 110 create a slot through which substrate access is provided.

Also, FIG. 4 shows three lift pins 122 arranged about the pedestal periphery, although other arrangements are possible. The lift pins are aligned with the pin engagement apertures 126 in the shadow ring, where the apertures may be slot, circular, elliptical, oblong, or otherwise shaped. In a preferred embodiment, the pin engagement aperture 126 are slots, dimensioned to adjust for any heat expansion difference between the shadow ring and the pedestal to retain suitable alignment between the shadow ring and the pedestal.

Figure 1:
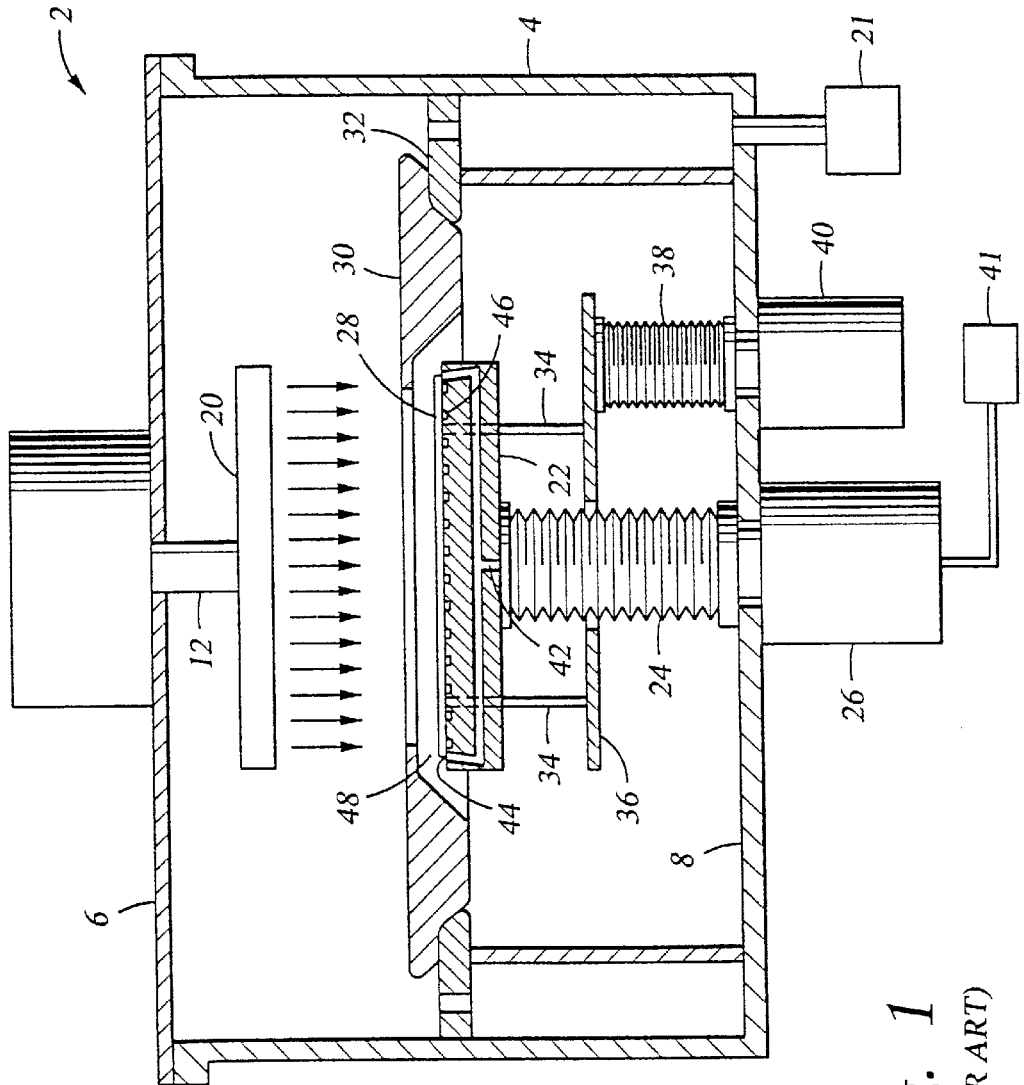
FIG. 1 is a cross sectional view of a prior art processing chamber having a shadow ring.
Figure 5:
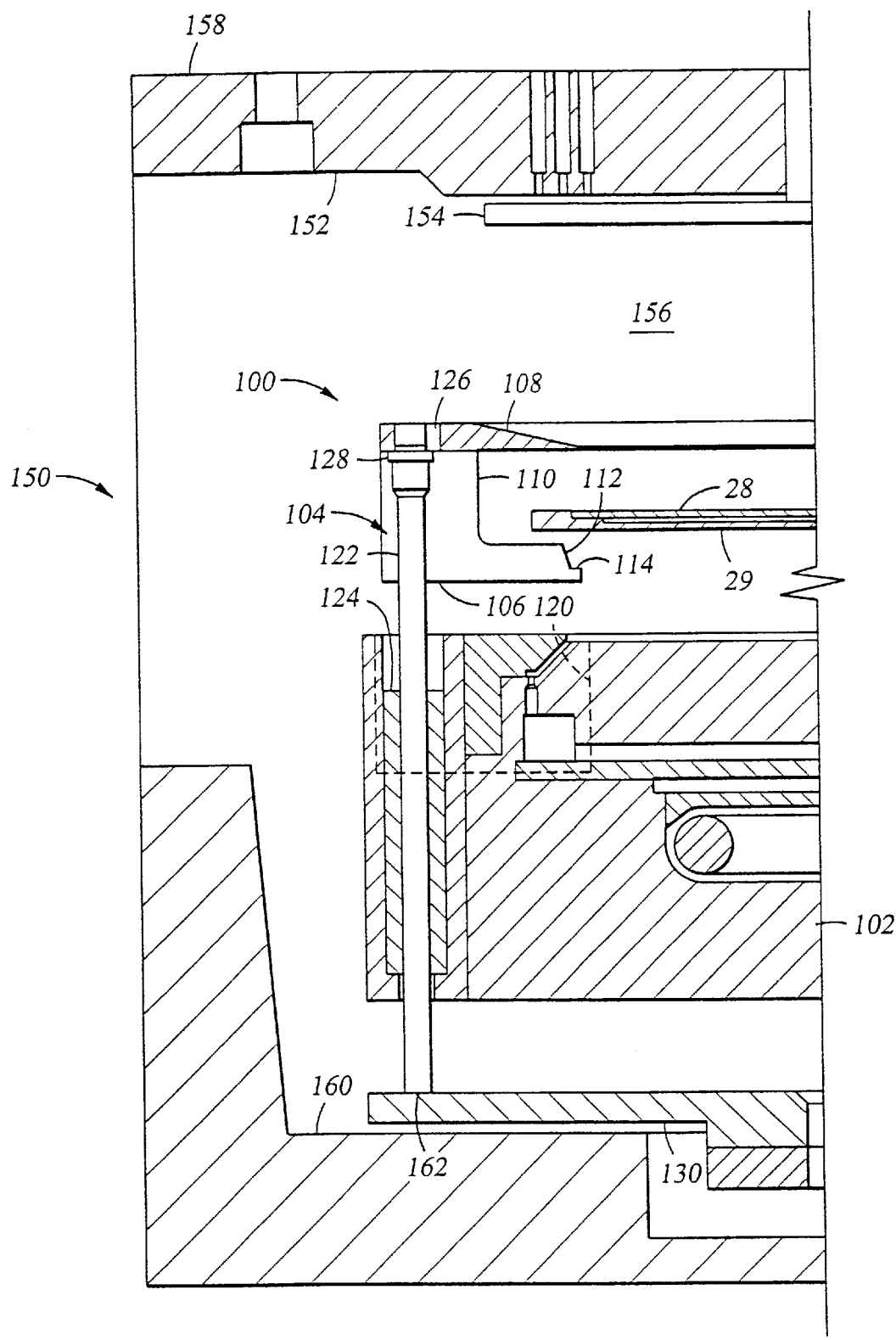
FIG. 5 is a cross sectional schematic of a chamber with the present invention in a substrate release/extract position.
Figure 6:
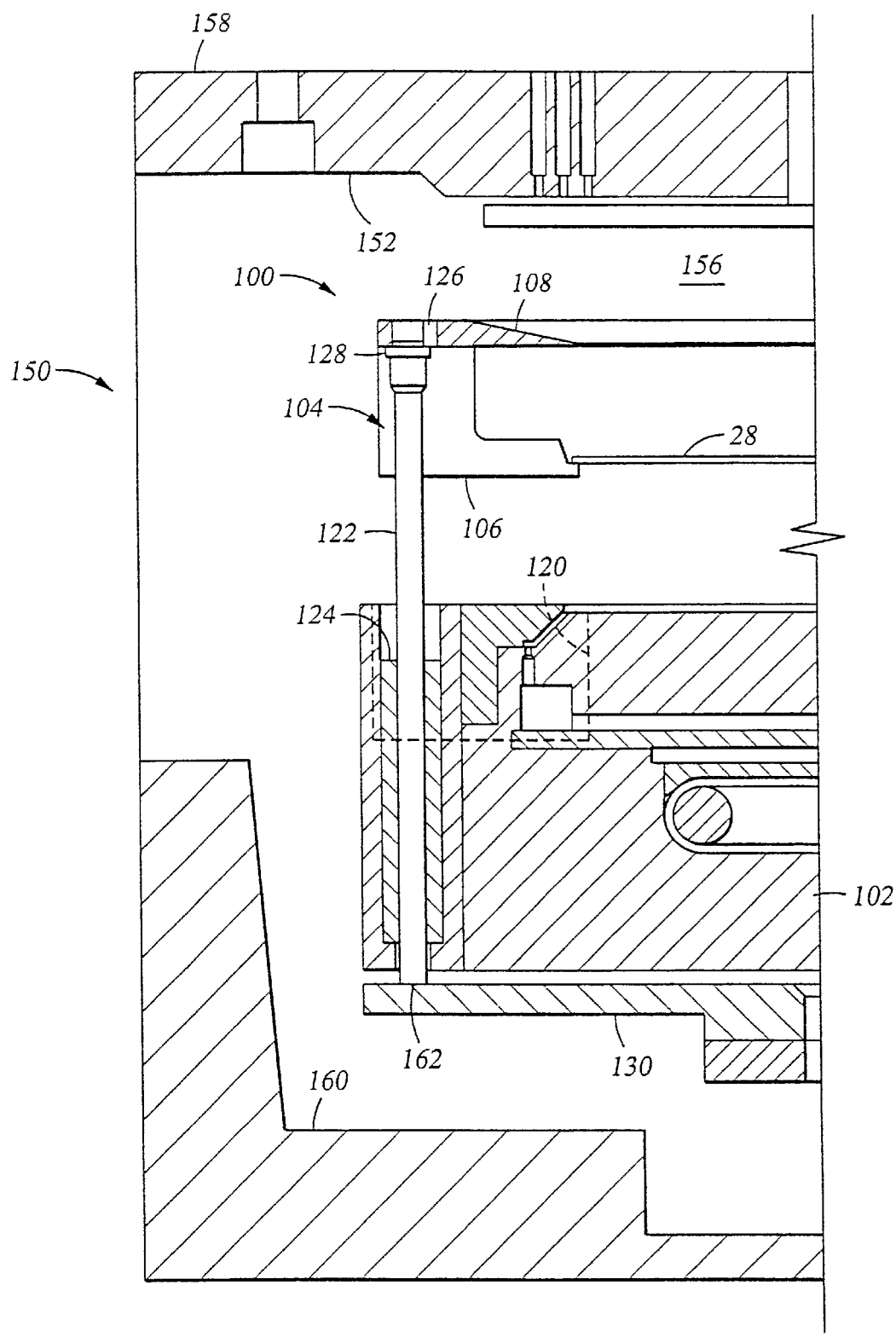
FIG. 6 is a cross sectional schematic of a chamber with the present invention in a substrate lift position.
Figure 7:
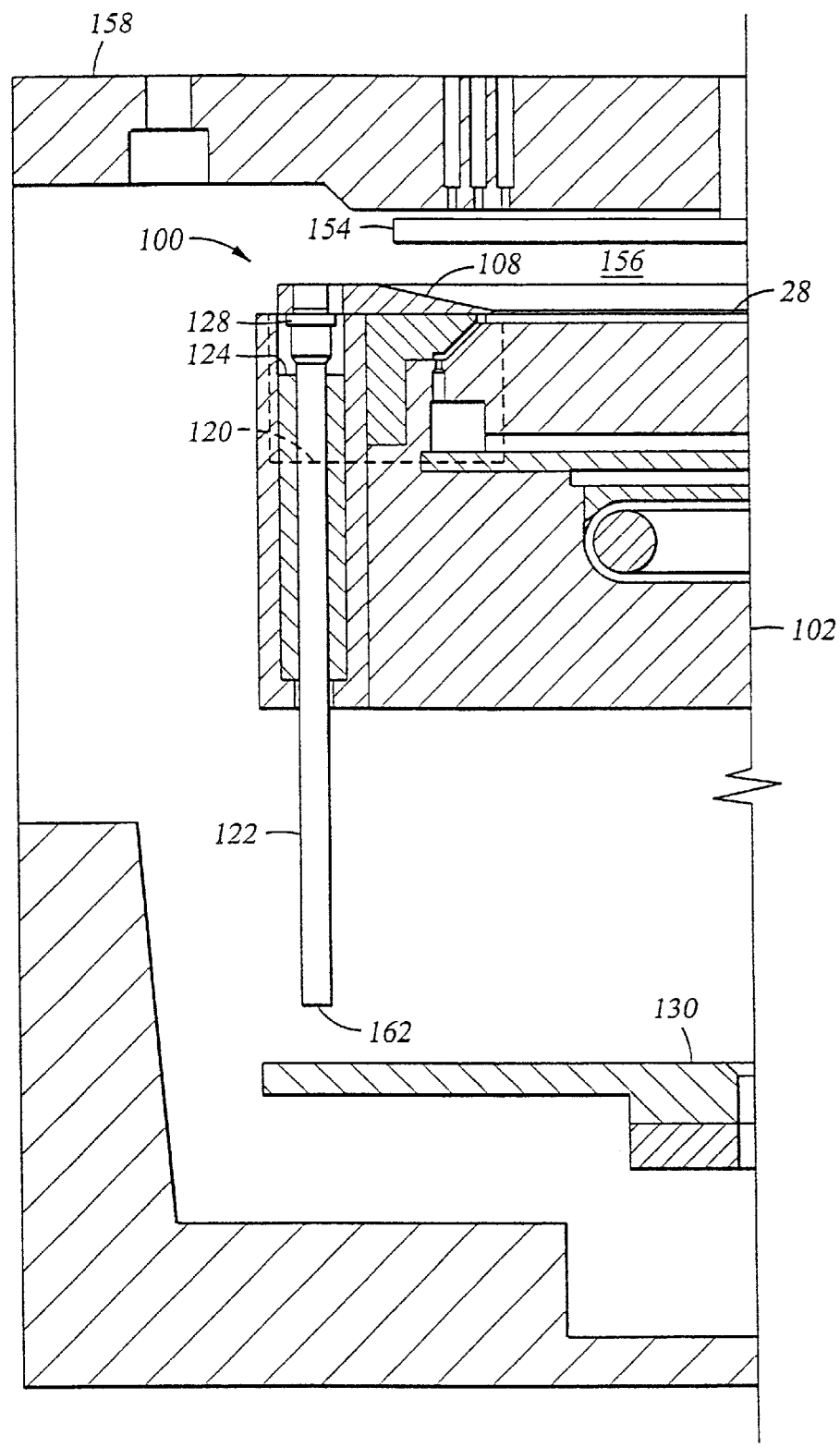
FIG. 7 is a cross sectional schematic of a chamber with the present invention in a substrate processing position.

FIGS. 5–7 show operation of the invention in three stages, including a substrate insertion or release position, a substrate engagement, alignment, and lift position with the shadow ring, and a substrate processing position, respectively, in a chamber 150. The elements are similarly numbered as in the other related figures. The shadow ring 100, pedestal 102, and lift plate 130 are shown inside a chamber 150. A top wall 152 allows gases to enter the chamber through a gas distribution element 154, similar to the gas distribution element 20 of FIG. 1, such as one in a CENTURA WxZ™ CVD reactor, manufactured and sold by Applied Materials, Inc. Between the pedestal 102 and the gas distribution element 154 is a reaction zone 156.

In operation, FIG. 5 shows the lift plate 130 in proximity to a chamber bottom wall 160 and pedestal 102 in a lowered position above the lift plate 130. The shadow ring 100 is also in a substrate access position, above the top of the pedestal 102. The upper shielding surface 108 of the shadow ring engages the pin stop 128 on one end of the pin 122 through the pin engagement aperture 126 and the lift plate 130 engages the pin distal end 162. A robot blade 29 introduces a substrate 28 through a slot (not shown) in the chamber 150 and positions the substrate between the upper shielding surface 108 and the lower support 114 in the recessed portion 110 area. The lift plate raises the lift pins which in turn raise the shadow ring whereupon the substrate alignment surface 112 and/or lower support 114 engages the substrate and lifts the substrate from the robot blade. The robot blade then retracts from the chamber and the substrate rests on the lower support 114, as is shown in FIG. 6. The frustoconical arrangement from the plurality of alignment and support tabs 106 create a self-centering arrangement for the substrate with respect to the shadow ring. The substrate alignment surface 112 may be dimensioned to receive the substrate along some portion of the substrate alignment surface, such that the substrate will positively contact the substrate alignment surface and adjust the substrate, if the alignment is initially offset.

FIG. 6 shows the lift plate 130 and pedestal 102 in a partially raised position. The shadow ring, including the lower alignment and support member 104 that in this instance includes alignment and support tabs 106, is still supported by the lift pin 122 that in turn is supported by the lift plate 130. A lift plate lift (not shown), such as the lift plate lift 40 of FIG. 1, may be a stepper motor and may be used to raise the lift plate 130. A pedestal lift (not shown), such as the pedestal lift 26 in FIG. 1, may also be a stepper motor and may be used to raise the pedestal 102. The pedestal lift generally operates independently of the lift plate lift.

FIG. 7 shows the pedestal 102 in a fully raised position and the lift pins 122 in a lowered position, no longer supported by the lift plate 130. The upper shielding surface 108 of the shadow ring is adjacent the substrate 28 and the alignment and support tabs 106 are recessed into the pedestal recesses 120 of the pedestal, whereupon the substrate is suitably positioned for processing.

Figure 2:
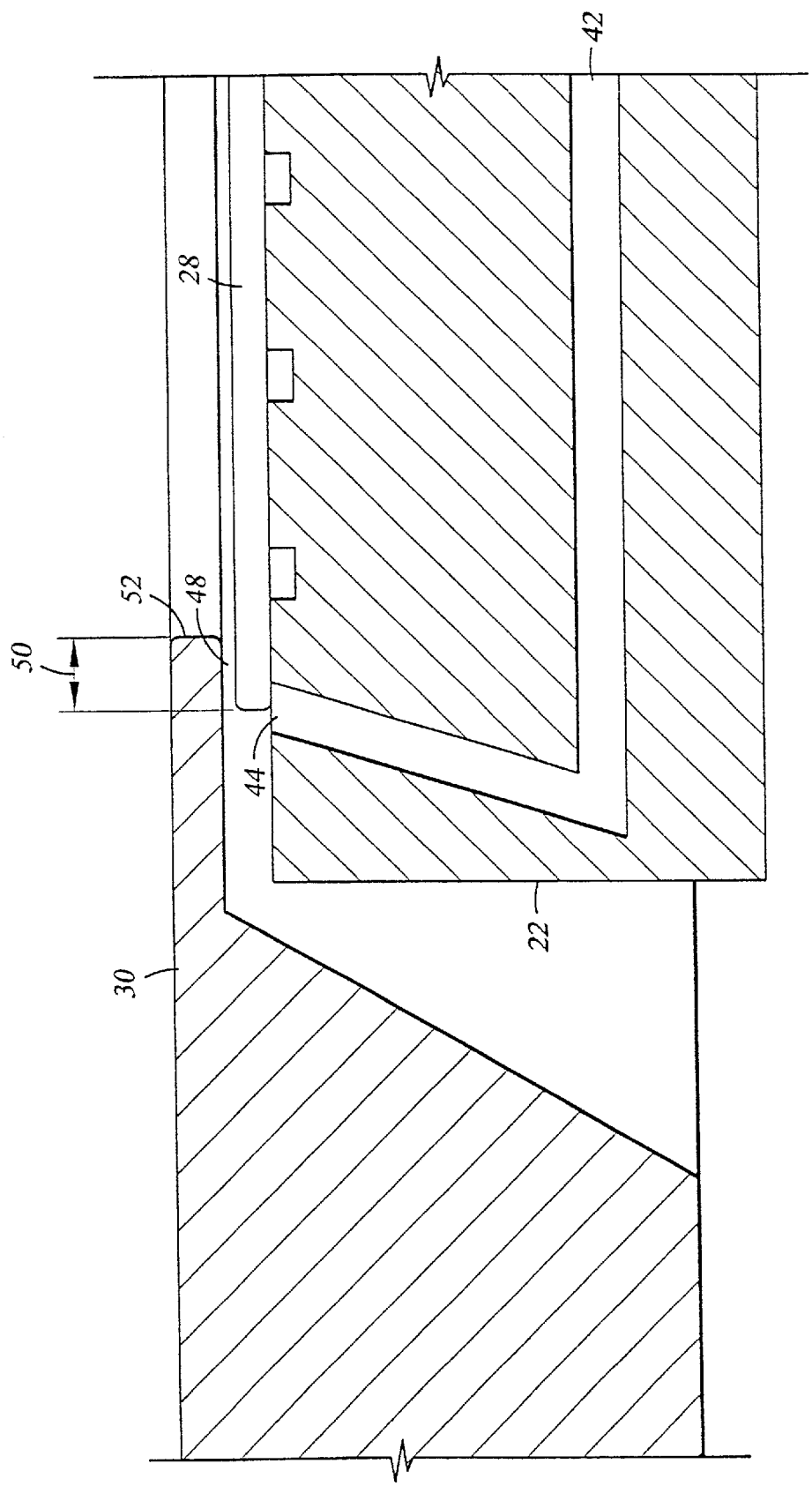
FIG. 2 is a detail of FIG. 1, showing the shadow ring position proximate to the substrate.

More specifically, the pedestal lift raises the pedestal to a height such that the pedestal engages the shadow ring and the pins 122 are fully received in the pedestal. As the pedestal continues to travel upwardly, the pedestal lifts the pins off the lift plate 130. The lift pins are retained in the pedestal by the pin stop 128. As the shadow ring is received on the pedestal by the upward travel of the pedestal, the alignment and support tabs 106, shown in FIG. 6, recede into the pedestal recesses 120. Also, as the shadow ring is received on the pedestal, the substrate 28 contacts the pedestal 102 and is disengaged from the lower support 114, shown in FIG. 5. A vacuum chuck system (including the vacuum apertures shown in FIG. 4) may secure the substrate 28 to the pedestal 102. However, at this point, the alignment of the shadow ring and substrate has already been directed by the alignment and support member 104, shown in FIGS. 3 and 5. Thus, the overlap of the substrate over the annular gas outlet 44 in the pedestal, shown in FIG. 2, through which the purge gas is ported to prevent backside deposition, is substantially uniform about the substrate circumference. As a result, the backside gas will be evenly distributed and vented through the gap 48 between the substrate and the shadow ring surface 108, and thereby provide uniform effect on substrate frontside deposition around the entire substrate perimeter.

To remove the substrate, the pedestal is lowered. As the pins engage the lift plate 130, the continued downward retraction of the pedestal separates the pins from the pedestal and thereby separates the shadow ring from the pedestal. Further pedestal retraction causes the lower supports 114 on the tabs 106 to engage the underside of the substrate and separate the substrate from the pedestal, ultimately positioning the substrate for removal from the chamber and replacement with another substrate to be processed in the chamber.

FIGS. 8 and 9 shows details of an alternative embodiment of the lift pin 180 that cooperates with the alignment and support tab 106. The lift pin 180 may be made from similar materials as the prior lift pin embodiment and has a pin slot 182, which is dimensioned to receive the alignment and support tab 106 and to align the shadow ring 100 with the pedestal 102. The lift pin 180 also has a pin stop 184, formed of a slotted flange, which functions similar to the pin stop 128 in the prior embodiment in that it provides a stop for the pin itself, so that the pin is retained in the pedestal when it is unsupported by the lift plate 130.

FIG. 10 shows a perspective view of the pin 180 engaging the alignment and support tab 106. Preferably, the width of the pin slot is dimensioned to engage the width of the tab 106 and to allow the tab to slide radially for expansion and contraction due to process thermal variations. Geometrically, at least three lift pin/tab sets are used to maintain alignment of the shadow ring with the pedestal. In this embodiment, the pin engagement aperture 126 of FIGS. 3–3b would generally not be needed to align the shadow ring with the pedestal. Additionally, the shadow ring may be structurally stronger without the discontinuities of the pin engagement apertures in the shadow ring.

Figure 11:
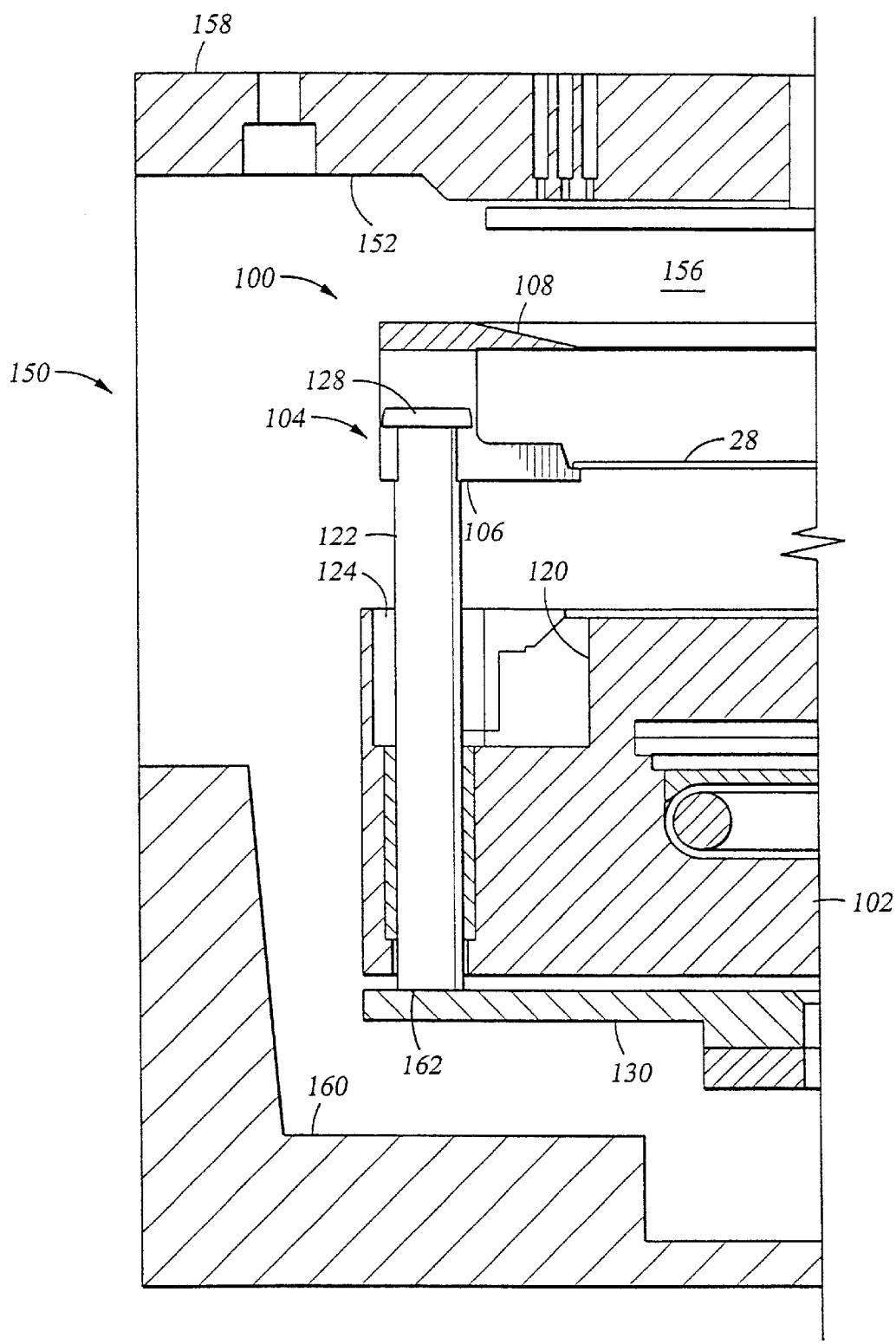
FIG. 11 is a cross sectional schematic of a chamber with the present invention in a substrate release/extract position, using the alternative embodiment of the lift pin shown in FIGS. 8 and 9.

FIG. 11 is cross sectional schematic of the chamber and corresponds to FIG. 6 of the prior embodiment. The pedestal 102 includes a plurality of pedestal apertures 124 through which the lift pins 180 are slidably restrained in the pedestal. A lift plate 130 is positioned to engage the distal end 162 of the lift pins and to raise and lower the lift pins and consequently the shadow ring, similar to the arrangement in the prior embodiment. The lift pins with the pin slot 182 are positioned to engage the alignment and support members, i.e., the alignment and support tabs 106, to form a plurality of lift pin/tab sets with preferably at least three lift pin/tab sets positioned about the pedestal. The pedestal recess 120 disclosed in the prior embodiment would be modified in this embodiment to allow space for the lift pin as the lift pin recedes into the pedestal when the shadow ring and the substrate are positioned on the pedestal, similar to the embodiment shown in FIGS. 5–7 and accompanying description, above. In operation, as the lift pins are raised and lowered, the lift pins restrain the movement of the alignment and support tabs and consequently the transverse movement of the shadow ring as a whole.

While foregoing is directed to the preferred embodiment of the present invention, other and further embodiments of the invention may be devised without departing from the basis scope thereof, and the scope thereof is determined by the claims that follow.

What is claimed is:

1. A method of aligning a substrate on a pedestal, comprising;

supporting a substrate shield on a plurality of lift pins, each lift pin having a head extending from the pedestal to engage and support the substrate shield;

aligning the substrate shield with the plurality of lift pins, wherein the substrate shield has a plurality of alignment apertures disposed therein for engagement by the head of the lift pins;

positioning the substrate between the substrate shield and at least one substrate alignment and support member attached to the substrate shield; and aligning the substrate relative to the substrate shield, wherein aligning the substrate shield further comprises extending the head of the lift pin through the alignment apertures and supporting the substrate shield on a pin stop segment of the lift pins.

2. A method of aligning a substrate shield and a substrate on a pedestal, comprising;

supporting a substrate shield having at least one substrate alignment and support member coupled thereto on a set of lift pins extending from a pedestal, wherein the lift pins are adapted to align the substrate shield in axial alignment with the pedestal;

lifting the lift pins using an elevator means to raise and lower the substrate shield relative to a substrate supporting surface of the pedestal;

inserting a substrate between the substrate shield and the alignment and support member;

positioning the substrate on the alignment and support member;

aligning the substrate relative the substrate shield;

raising the pedestal toward the substrate shield; and receiving at least one of the alignment and support members within a recess of the pedestal to align the substrate shield therewith, wherein the shield includes a plurality of alignment apertures disposed therein adapted for engagement with a head of one of the lift pins, and wherein supporting the substrate shield further comprises extending the head of the lift pin through the alignment apertures and supporting the substrate shield on a pin stop segment of the lift pins disposed adjacent the head.

* * * * *

UNITED STATES PATENT AND TRADEMARK OFFICE
CERTIFICATE OF CORRECTION

PATENT NO. : 6,555,164 B1
DATED : April 29, 2003
INVENTOR(S) : Yudovsky

It is certified that error appears in the above-identified patent and that said Letters Patent is hereby corrected as shown below:

<u>Column 4,</u>
Line 56, please change "ceranic" to -- ceramic --.

Signed and Sealed this

Thirteenth Day of January, 2004

JON W. DUDAS
*Acting Director of the United States Patent and Trademark Office*